United States Patent [19]

Montana

[11] 4,251,767
[45] Feb. 17, 1981

[54] DUAL CHANNEL CAPACITANCE MEASUREMENT DEVICE

[76] Inventor: Donald M. Montana, 27 Woodberry Rd., New Hartford, N.Y. 13413

[21] Appl. No.: 937,021

[22] Filed: Aug. 25, 1978

[51] Int. Cl.³ ............................................. G01R 27/26
[52] U.S. Cl. .................................................... 324/60 C
[58] Field of Search ............ 324/60 C, 61 R, 60 CD, 324/60 R

[56] References Cited
U.S. PATENT DOCUMENTS 4,065,715  12/1977  Jaffe et al. ...................... 324/60 CD Primary Examiner—Ernest F. Karlsen
Attorney, Agent, or Firm—Donald J. Singer; Robert Kern Duncan

[57] ABSTRACT

The capacitance of an unknown capacitor is determined by counting the cycles of a known frequency contained within a time gate whose time duration is determined by subtracting a gate whose length is equivalent to the stray measuring capacitance from a gate whose length is determined by the capacitance of the unknown capacitor plus the unavoidable stray measuring capacitances.

1 Claim, 12 Drawing Figures

DUAL CHANNEL CAPACITANCE MEASUREMENT DEVICE

RIGHTS OF THE GOVERNMENT

The invention described herein may be manufactured and used by or for the Government of the United States for all governmental purposes without the payment of any royalty.

BACKGROUND OF THE INVENTION

The field of the invention is in the capacitance measuring art.

Meters and instruments for measuring the capacity of capacitors are well known. The combination of an oscillator and a counter wherein the frequency of the oscillator is a function of the unknown capacitance and the counter counts cycles per unit of time; or the combination wherein the frequency of the osicillator is fixed and the number of cycles is counted that appear in a time gate, the length of which is a function of the unknown capacitor are well known. There are always stray capacitances in the measurement. These stray capacitances exist in the control circuits of the measuring device, in the leads or connections to the unknown capacitor, and in various capacitances to ground. Some capacitance measuring devices attempt to compensate for stray capacitances with a fixed amount of calculated or empirically determined balancing capacity. Frequently the unknown capacitor whose capacitance magnitude is desired is physically located in a structure such that it is not desirable to remove it and connect it to the measuring device in a determined manner, but must be connected to the measuring device with test leads of some description, with unknown and indetermined amounts of stray capacitances. In these instances the conventional measurements of capacitances are substantially only approximations.

The best known prior art may be found in the following U.S. Pat. Nos.: 3,761,805 to patentee Dornberger; 3,805,149 to patentee Delapierre; 3,882,380 to patentee Black; and 4,001,813 to patentee Kosakowski.

SUMMARY OF THE INVENTION

An economical, accurate, and convenient to use capacitance measurement instrument is disclosed that eliminates the inclusion of stray capacitances in the measurement of an unknown capacitor by having a dual channel capacitance measurement circuit. One channel provides a time gate proportional to the unknown capacitance plus stray capacitances. The other channel provides a time gate that is adjusted to be proportional to the stray capacitances. By subtracting the latter time gate from the former a time gate equal to the unknown capacitor is obtained. This gate is measured by counting the contained cycles of a reference oscillator which is a measure of the true capacitance of the unknown capacitor.

BRIEF DESCRIPTION OF THE DRAWING

FIG. 6b is the other half of a typical counter and display circuit;

DESCRIPTION OF THE PREFERRED EMBODIMENT

Figure 1:
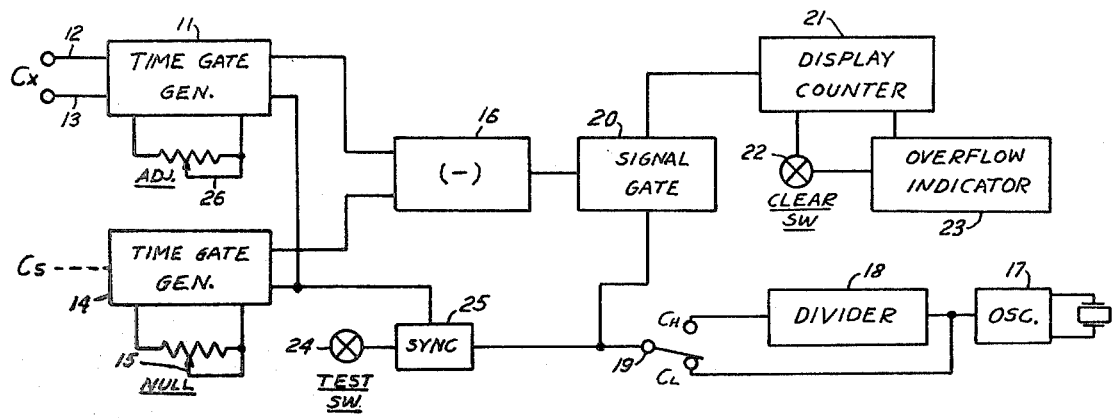
FIG. 1 is a simplified block-schematic diagram of an embodiment of the invention.

Referring to the simplified block-schematic diagram of a typical embodiment of the invention shown in FIG. 1, the unknown capacitor Cx whose capacitance value is to be determined is connected to the monostable (one shot) multivibrator 11. This multivibrator generates an output gate whose time duration, or length, is proportional to the capacitance of the device under test (DUT), plus the accumulated stray capacitances within the multivibrator 11, that between the leads 12 and 13 connecting the capacitor to the multivibrator, and various other capacitances to earth (ground). By having a substantially identical multi-vibrator time gate generator 14, which has substantially the same stray input capacitances and whose output gate may be adjusted by the null control 15 to compensate for connecting leads 12 and 13 capacitance, and other slight differences in stray capacity, the effect of the stray capacitances are eliminated in the subtracting of the gate time of generator 14 from that of generator 11. This is indicated by the subtraction indication block 16. The resulting time gate, a true measure of the capacitance of the DUT, gates a wave train of pulses of known frequency from conventional high quality stable crystal oscillator 17 or from the divider 18. The number of pulses passed by the gate are counted and displayed in the counter and indicator 21. Clear switch 22 clears the counter 21 and overflow indicator 23 after a measurement. Test switch 24 synchronously initiates the generation of the time gates with a common pulse from the oscillator-divider circuits by sync control 25. Adjustable control 26 calibrates the instrument so that the digital readout from the counter is correct and depending on the setting of switch 19 either in nanofarads or microfarads of capacitance. Null adjustment 15 zero's the readout of the device with all leads attached, but without the DUT being connected to the leads.

A specific embodiment of the invention will now be described in detail. Operation of this embodiment will be described and typical results for a particular embodiment will be given to aid those practicing the invention. It is to be understood that the invention is not to be limited by the details of the specific embodiment, but only by the scope of the appended claims. The schematic diagrams of FIGS. 2, 3, 4, 5a and 5b illustrate a digital capacitance measuring device having six digit numeric emitting diode readout capable of measuring capacitance within the range of one (1) picofarad to 999.999 microfarads with an accuracy of one (1) percent ±one (1) count. The unique dual channel measurement concept which provides the cancellation of stray capacitance errors is the principal feature of this invention. The fact that this specific embodiment employed TTL integrated circuits, performed a count of clock pulses derived from a crystal oscillator, used a manual test switch and clear switch and used a light emitting diode (LED) type of digital display, is not critical to this invention. The logic devices used could have been ECL, MOS, C-MOS or the entire invention could have been incorporated on a single LSI integrated circuit. Similarly, the display could be implemented in LCD or via CRT display. Finally, other sources of a stable frequency clock could have been used instead of a TTL crystal oscillator.

Figure 6:
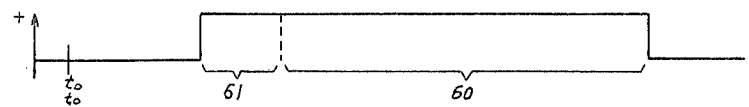
FIG. 6 is a typical voltage waveform of the output of a monostable multivibrator generating a time gate that includes the value of the unknown capacitance.
Figure 7:
FIG. 7 is a typical voltage waveform of the output of a monostable multivibrator generating a time gate equivalent to stray capacitances.
Figure 8:
FIG. 8 is a typical voltage waveform showing the subtracting of the time gate of FIG. 7 from that of FIG. 6.
Figure 9:
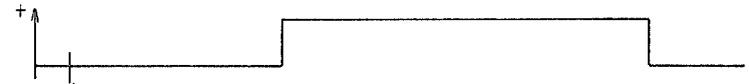
FIG. 9 illustrates the gate inversion of FIG. 8.

The detail operation of the invention may be best understood by first considering the more important waveforms as typically illustrated in FIGS. 6 through 11. As previously stated, this capacitance measurement device embodies a dual channel capacitance measurement circuit. One channel (the measurement channel) consists of a monostable multivibrator, U10 FIG. 1, which produces a gate output whose width is determined by an RC time constant where the capacitance (C) consists of the capacitance $C_x$, of the device under test (DUT) plus the total stray capacitance $C_s$ of the circuit and wiring. This gate is illustrated in FIG. 6 by time 60 representing $C_x$ and time 61 $C_s$. The second channel (the nulling channel) consists of a similar multivibrator U9 FIG. 2, which produces a gate output whose width is set to a value of RC time constant simulating only the stray capacitance of the measurement channel. This gate is illustrated in FIG. 7 by time length 70. These two gates are applied to nand gate U8B, FIG. 2, whose output is illustrated by the waveform shown in FIG. 8 with width 80 proportional to the capacitance of $C_x$ only. The gate is then inverted as shown in FIG. 9 to provide a positive going gate.

Figure 3:
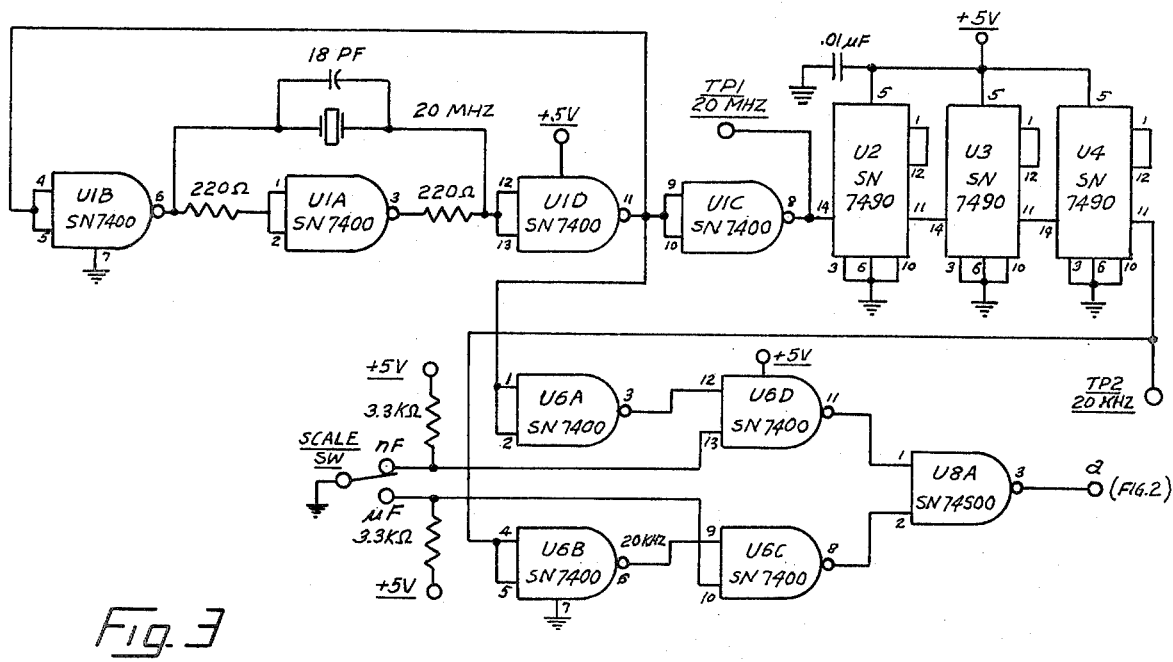
FIG. 3 is a detailed schematic diagram of a typical oscillator and divider circuit.
Figure 2:
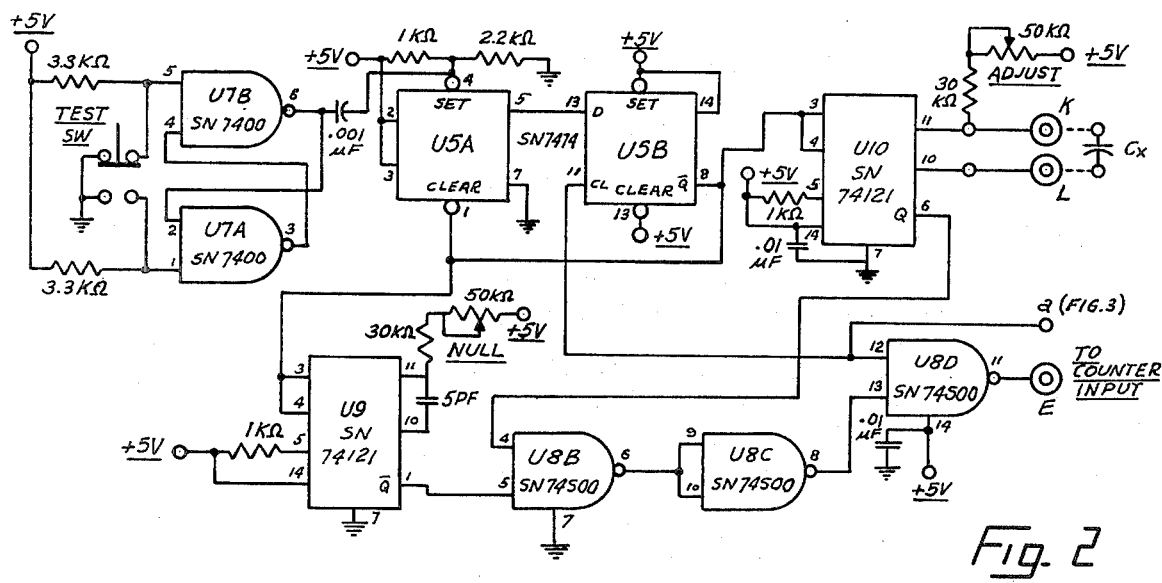
FIG. 2 is a detailed schematic diagram of typical time gate generation and comparison circuits of an embodiment of the invention.
Figure 4:
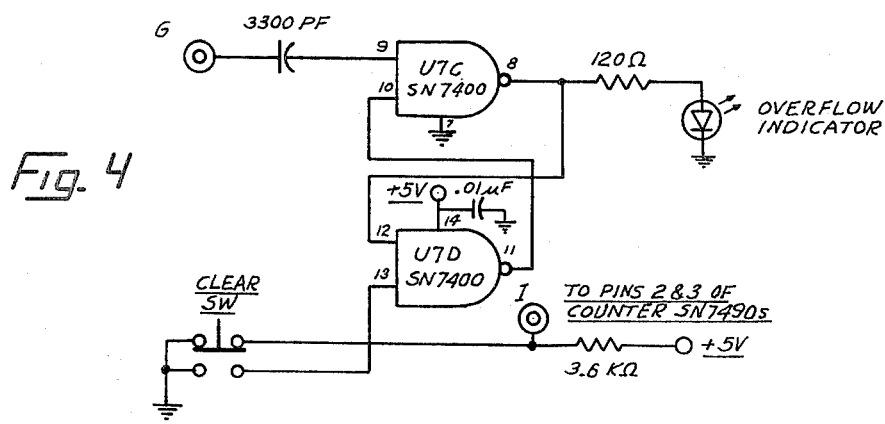
FIG. 4 is a detailed schematic diagram of a typical over-flow indicator and clear circuit.
Figure 10:
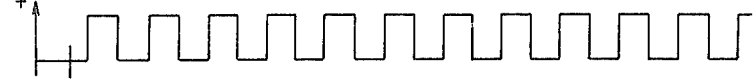
FIG. 10 illustrates a train of clock pulses.
Figure 11:
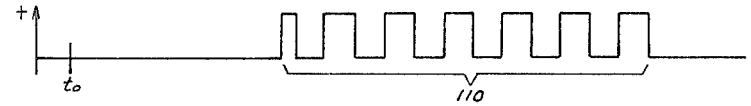
FIG. 11 illustrates a typical gated number of pulses that is representative of a value of capacitance.

A continuous stream of clock pulses from the oscillator divider circuit of FIG. 3 as illustrated by FIG. 10 with the gate of FIG. 9 are then applied to coincidence nand gate U8D, FIG. 2, whose output FIG. 11 then consists of a set of clock pulses 110 proportional to the capacitance of the DUT. This output is then supplied to the counter/display circuit, FIGS. 5a and 5b, for direct display of the capacitance of the DUT. Without such a nulling feature, it would not be possible to measure values of capacitance accurately, particularly low values of capacitance where the magnitude of the stray capacitances becomes an appreciable amount of that of the DUT.

Referring primarily to FIGS. 2, 3, 4, 5a and 5b, the detailed operation of the circuits is briefly as follows. The principal measurement component of this circuit is a conventional TTL SN74121, or equivalent, integrated circuit monostable multivibrator, U10, which produces a single (one shot) output gate, (FIG. 6), whose time duration is approximately proportioned to the external capacitance of the device under test (DUT). The invention contains a conventional crystal controlled TTL SN7400 oscillator, UI, (a quad nand gate) which produces a basic 20 megahertz clock.

The measurement of capacitance is thus the direct count of clock pulses which occur during the time interval of the gate produced by the U10 (SN74121) one shot, minus the time interval of the gate produced by the U9 (SN47121) one shot. The measurement of capacitance is initiated by depressing the Test Switch which incorporates a TTL SN7400 debouncing circuit U7A,B. The debounced output is then conditioned by a TTL SN7474 one and only one circuit U5A,B which selects a single clock pulse derived from the TTL crystal oscillator to start the U10 one shot gate and the U9 one shot gate. This provides a one shot gate start having the precision of the TTL crystal oscillator rather than the crude command produced by the debounced test switch.

TTL Decade counters SN7490 U2, U3, and U4 perform a divide by 1000 to produce a second clock at 20 kilohertz thus enabling switch selection of the measurement range of the capacitance meter. Selection of the measurement range is performed by depressing the scale switch which enables either TTL SN7400 nand gate U6C in the microfarad range position or SN7400 nand gate U6D in the nanofarad range position. The selected TTL clock (20 MHz or 20 KHz) is routed to SN 7400 nand gates U8A and U8D in turn.

TTL nand gate U8D provides a coincidence function to select only those clock pulses which occur during the time interval of the one slot enabling gate produced by $C_x$. A measurement error results from the inherent stray capacitance of the U10 SN74121 and the associated wiring of the printed circuit board and the wires and terminals to which the DUT is to be connected. The unique feature of this device is the dual measurement channel provided by a second TTL SN74121, U9, which produces a gate whose width is proportional to the inherent stray capacitance experienced by U9. The subtraction (or nulling) of the stray capacitance $U9\bar{Q}$ gate from the DUT capacitance U10Q gate is performed by TTL SN7400 nand gate U8B. This provides an output enable gate whose width is controlled by the capacitance of the DUT alone as measurement error produced by stray capacitance has been cancelled in nand gate U8B. The enable gate is inverted by nand gate U8C providing the required positive going sampling gate to the coincidence gate U8D. The clock pulses enabled by U8D are thus proportional to $C_x$ alone.

Figure 5A:
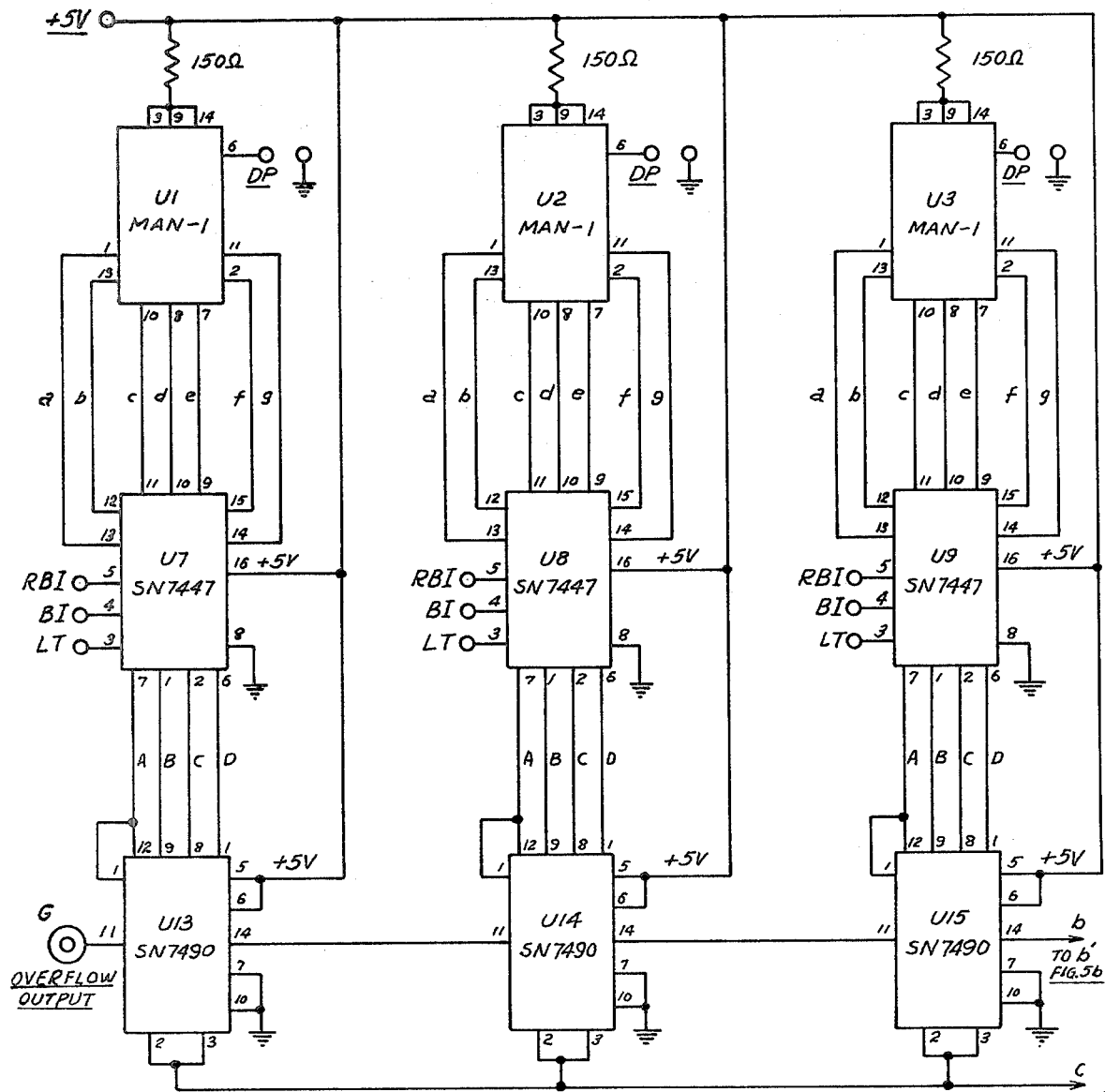
FIG. 5a is a schematic diagram of half of a typical counter and display circuit.
Figure 5B:
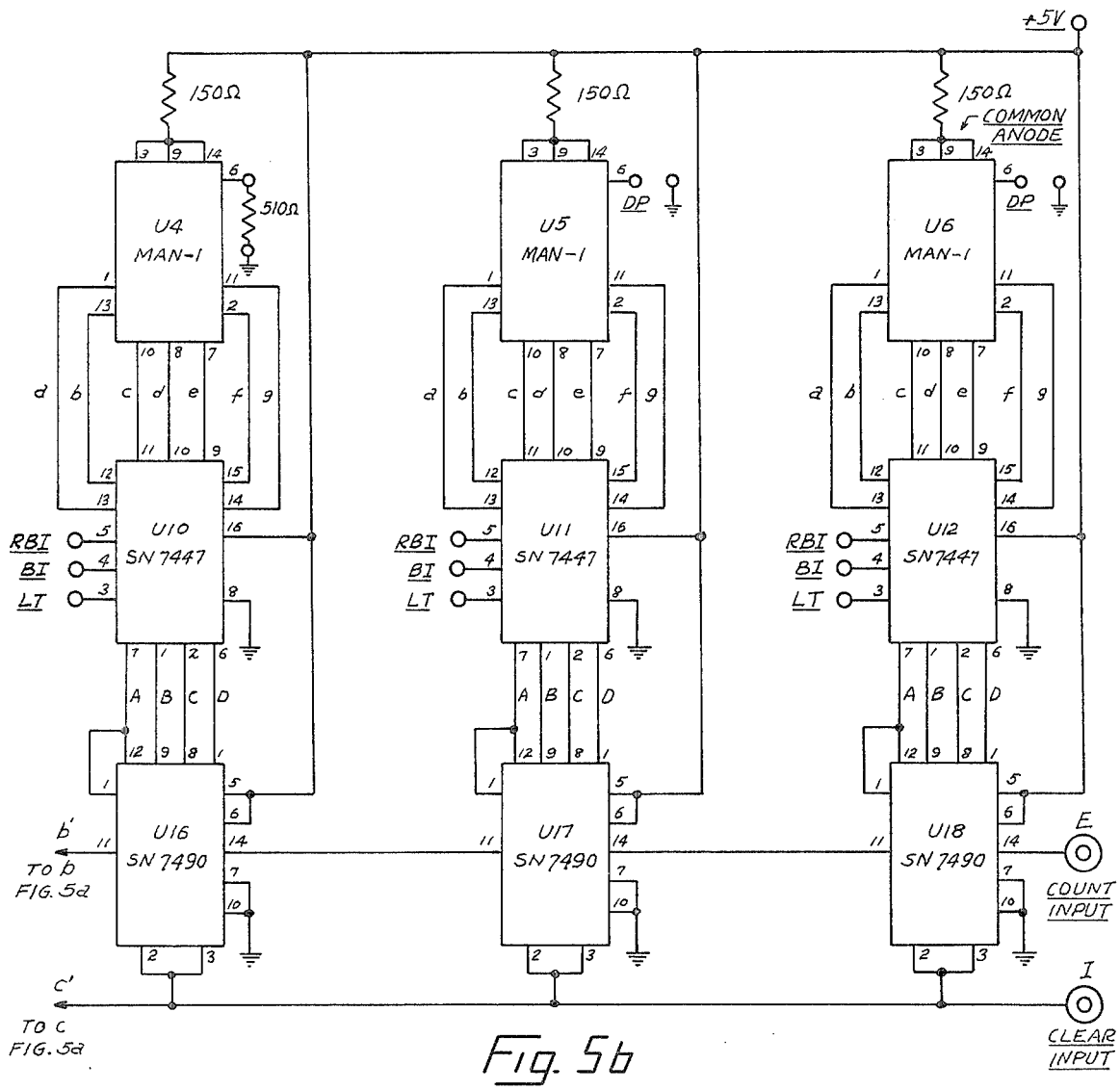

The output of nand gate U8D is thus supplied to the counter/display circuit, FIGS. 5a and 5b. Other outputs to the counter/display circuit are clear command which sets the counter to zero prior to a measurement and an output which illuminates the overflow light emitting diode (LED) indicating the need to change scales from the nanofarad range to the microfarad range. The clear function is initiated by depressing the clear switch which is debounced by TTL SN7400 U7C,D supplying a high logic level output needed to reset the counters in the counter/display circuit. An overflow pulse is supplied by the last counter in the counter/display circuit to nand gate U7C, and nand gates U7C,D wired as monostable flip-flop produce a continual sink output to the overflow LED until the clear switch is depressed.

The counter/display circuit of this specific embodiment as illustrated in FIGS. 5a and 5b consists of a conventional six (6) stage TTL SN7490 decade counter whose four (4) bit binary coded decimal (BCD) output is decoded by a TTL SN7447 BCD to seven segment decoder/driver. One SN7447 is used for each of the six (6) SN7490 decade counters. The output of each SN7447 decoder/driver is connected to a seven (7) segment LED display.

Conventional commercially available components are used throughout the construction of the invention.

In this detailed description specific components are enumerated, but other substantially equivalent components may be used. For instance, type SLA-1 LED indicators may readily be used in place of the type MAN-1. Those familiar with these indicators realize that the decimal point resistor connecting terminal 6 of U4 MAN-1 to ground will be changed from the 510 ohm value used with type MAN-1 to a 51 ohm value for the type SLA-1. The terminals 3, 4, and 5 of the SN7447 decoder/drivers are, respectively, light test (LT), blanking input (BI), and ripple blanking input (RBI) test terminals and are unused in the general operation of the device. They are valuable and used for testing and trouble-shooting of the instrument.

The following information will be useful to those practicing this invention in understanding typical capabilities of various embodiments. Typical TTL monostable multivibrators such as the type SN74121 described in the detailed embodiment generate a gate whose width is equal to $R_T \cdot C_X \cdot \log_e 2$. This particular IC is capable of operating with values of capacitance up to approximately 1000 microfarads. Typical values of internal capacitance of the IC and normal external stray capacitances, such as of the printed circuit board, wiring, connecting leads, etc., produce a residual capacitance of approximately 10 to 20 picofarads. If it were not for the nulling feature capacitance readings would generally be in error and high or limited by approximately this amount, depending upon any type of off-set calibration used. It is to be noted that this error is not constant but depends upon the location of the DUT and the manner in which it is connected to the device. It is thus apparent why a fixed amount of "offset" cannot be built into the instrument and used for all measurements. The null adjustment of U9 SN74121 provides a means of nulling or zeroing the instrument for each measurement or as often as desired. Ideally, with all leads in place, but without the DUT being connected to the leads, the indicator should read 000.000 with the scale switch in the nanofarad position. If it does not, the null control is adjusted to obtain the zero reading. In placing the instrument into initial operation it has been found generally desirable to make the following calibration and adjustments. Connect a precision $0.1 \pm 1\%$ microfarad capacitor to terminals K and L. If the capacitor is polarized, connect the positive side of the capacitor to terminal K. With the scale switch set to nF (nanofarads) the readout of the measurement in the indicator should be in the range 99.0 to 101.0 nanofarads. Sequentially press the "clear" and the "test" switches and observe the measured value displayed. By turning the "adjust" potentiometer and repeating the "clear" and "test" switch commands the displayed measurement is adjusted to read 100.0 nanofarads. Note, that the residual stray capacitances have not as yet been nulled out and may appear in the hyndredths or thousandths place, such as 100.037.

To perform the "null" adjustment disconnect the precision capacitor used in the previous step and with the scale switch still in the nF position press the clear and test switches successively while adjusting the "null" potentiometer until the display reads 000.000 nonofarads. To achieve a more precise null adjustment it has been found desirable to connect a small value, i.e., $2 \pm \frac{1}{2}$ percent picofarad capacitor to the terminals for connecting the DUT and trim the null potentiometer for a displayed value of 0.002. Disconnect the 2 picofarad capacitor and recheck the null reading. If the displayed reading is still 000.000 nanofarads, the meter calibration is completed. If it is not repeat this last step with the 2 picofarad capacitor. This calibration will be valid until a change in lead lengths, lead positions or other structure is made effecting the magnitude of stray capacitance.

The precision of any measuring instrument can be determined by examining the repeatability of a measurement. In the particular embodiment of the invention just described in detail a 12 picofarad silver mica capacitor was measured 100 times. In 98 tries the displayed measurement value was 000.012 nanofarads (12pF), while in the other 2 tries the display value was 0.011 nanofarads (11pF).

Three capacitors whose nominal values were 0.1 microfarads, 1.0 microfarads and 100 microfarads were each measured 50 times. The results of these tests are as follows:

| Nominal Value | Standard Deviation | Percent Error |
| --- | --- | --- |
| 0.1 microfarad | 0.032955 | +0.656% |
|  |  | −0.598% |
| 1.0 microfarad | 0.001698 | +0.704% |
|  |  | −0.242% |
| 100 microfarads | 0.15493 | +0.386% |
|  |  | −0.210% |

In performing these tests of the measuring instrument relatively high quality, stable, capacitors were used, such as silver mica, monobloc ceramic, mylar, and tantalum type capacitors.

I claim:

1. A dual channel capacitance measurement device providing a display of the capacitance of the device under test without the inclusion of stray capacitances, comprising:
 a. means for generating a train of clock pulses of known frequency;
 b. means for generating a first time interval gate proportional to the capacitance of the device under test including stray capacitances;
 c. means for generating a second time interval gate proportional to the said stray capacitances;
 d. means for synchronizing the said first time gate means and the said second time gate by the said train of clock pulses;
 e. means for subtracting the said second time interval gate from the said first time interval gate and providing a third time interval gate proportional to the capacitance of the device under test;
 f. means cooperating with the said third time interval gate and the said train of clock pulses for gating a number of said clock pulses responsive to the said third time interval; and
 g. means for counting and displaying the said number of gated clock pulses.

* * * * *